United States Patent
Zhang et al.

(10) Patent No.: US 9,899,192 B2
(45) Date of Patent: Feb. 20, 2018

(54) GAS INTAKE DEVICE OF MAGNETRON SPUTTERING VACUUM CHAMBER AND MAGNETRON SPUTTERING APPARATUS

(71) Applicants: BOE TECHNOLOGY GROUP CO., LTD., Beijing (CN); HEFEI BOE DISPLAY LIGHT CO., LTD., Anhui (CN)

(72) Inventors: Qiping Zhang, Beijing (CN); Wenbo Sun, Beijing (CN)

(73) Assignees: BOE TECHNOLOGY GROUP CO., LTD., Beijing (CN); HEFEI BOE DISPLAY LIGHT CO., LTD., Hefei, Anhui (CN)

( * ) Notice: Subject to any disclaimer, the term of this patent is extended or adjusted under 35 U.S.C. 154(b) by 267 days.

(21) Appl. No.: 14/603,527

(22) Filed: Jan. 23, 2015

(65) Prior Publication Data

US 2016/0196956 A1   Jul. 7, 2016

(30) Foreign Application Priority Data

Jan. 5, 2015 (CN) .......................... 2015 1 0003435

(51) Int. Cl.
   *C23C 14/34*   (2006.01)
   *H01J 37/34*   (2006.01)
   *H01J 37/32*   (2006.01)

(52) U.S. Cl.
   CPC ...... *H01J 37/3244* (2013.01); *H01J 37/3405* (2013.01); *H01J 37/3464* (2013.01); *H01J 2237/332* (2013.01)

(58) Field of Classification Search
   CPC .............. H01J 37/3244; H01J 37/3405; H01J 37/3464; H01J 2237/332
   (Continued)

(56) References Cited

U.S. PATENT DOCUMENTS 5,556,520 A * 9/1996 Latz .................... C23C 14/0042
                                                        204/192.13
5,643,394 A * 7/1997 Maydan ............ C23C 16/45574
                                                         118/723 E (Continued)

FOREIGN PATENT DOCUMENTS

CN       1274823 A       11/2000
CN       1468972 A        1/2004

(Continued)

OTHER PUBLICATIONS

First Chinese Office Action dated Jun. 2, 2016, Appln. No. 201510003435.6.

(Continued)

*Primary Examiner* — Rodney McDonald
(74) *Attorney, Agent, or Firm* — Ladas & Parry LLP (57) ABSTRACT

A gas intake device of magnetron sputtering vacuum chamber and a magnetron sputtering apparatus with the gas intake device, the gas intake device of magnetron sputtering vacuum chamber comprises a gas mixing box configured to receive and mix the gas, a gas intake box configured to introduce the gas into a vacuum chamber, and a connecting pipe configured to connect with the two boxes, the gas mixing box has one or more gas intake pipes. The gas intake device can increase the distribution uniformity after the gas enters inside the vacuum chamber, effectively decrease the impact force to the precision equipment(s) in the vacuum chamber, and extend the service life of the apparatus.

19 Claims, 4 Drawing Sheets

(58) Field of Classification Search
USPC .................................................. 204/298.07
See application file for complete search history.

(56) References Cited

U.S. PATENT DOCUMENTS

| | | | |
|---|---|---|---|
| 5,871,812 A | 2/1999 | Hwang et al. | |
| 5,996,528 A * | 12/1999 | Berrian | C23C 16/45565 118/723 E |
| 6,537,428 B1 * | 3/2003 | Xiong | C23C 14/0036 204/192.13 |
| 2005/0029088 A1 * | 2/2005 | Delahoy | C23C 14/08 204/192.12 |
| 2008/0264784 A1 * | 10/2008 | Pecher | C23C 14/34 204/298.07 |
| 2010/0154710 A1 | 6/2010 | Priddy et al. | |
| 2011/0064877 A1 * | 3/2011 | Matsumura | C23C 14/34 427/248.1 |

FOREIGN PATENT DOCUMENTS

| | | |
|---|---|---|
| CN | 201326008 Y | 10/2009 |
| CN | 102301032 A | 12/2011 |
| CN | 202744622 U | 2/2013 |
| CN | 103396008 A | 11/2013 |
| CN | 203333750 U | 12/2013 |
| CN | 203382661 U | 1/2014 |
| CN | 203440440 U | 2/2014 |
| EP | 0768702 A1 | 4/1997 |
| EP | 1054311 A1 | 11/2000 |
| JP | 2007-335755 A | 12/2007 |
| JP | 2011-017065 A | 1/2011 |

OTHER PUBLICATIONS

Extended European Search Report Appln. No. 15155006.8—1551; dated Mar. 21, 2016.
Second Chinese Office Action dated Nov. 25, 2016; Appln. No. 201510003435.06.

* cited by examiner

GAS INTAKE DEVICE OF MAGNETRON SPUTTERING VACUUM CHAMBER AND MAGNETRON SPUTTERING APPARATUS

TECHNICAL FIELD

The embodiments of present disclosure relate to a gas intake device of magnetron sputtering vacuum chamber and a magnetron sputtering apparatus.

BACKGROUND

The manufacturing of a TFT-LCD (Thin Film Transistor-Liquid Crystal Display) panel mainly comprises three stages as follows: an array process, an assembly process and a module process. The array process comprises depositing a metal film on a clean glass substrate by using a film deposition apparatus, then depositing a nonconductive layer and a semi-conductive layer, and next forming circuit patterns on the glass substrate by exposure, development, and photoresist stripping process and so on, and finally performing an etching process to form needed circuit patterns (comprising thin film transistor); the array process is accomplished after the aforesaid processes are repeated five to seven times.

Magnetron sputtering technology is widely used in sputtering technologies. The principle of the magnetron sputtering technology is explained as follows. Electrons are accelerated under the action of an external electric field and collide with atmosphere gas atoms in the vacuum chamber so as to be ionized to produce positive ions and electrons. The positive ions are accelerated to bombard the target under the action of the external electric field, and the particles (atoms or ions) of the target are sputtered out and deposited on the substrate to form a thin film. If the protectiveness of the inert gases, the sputtering yield and the industrial cost are considered, argon gas is considered as the optimal sputtering gas.

Figure 1:
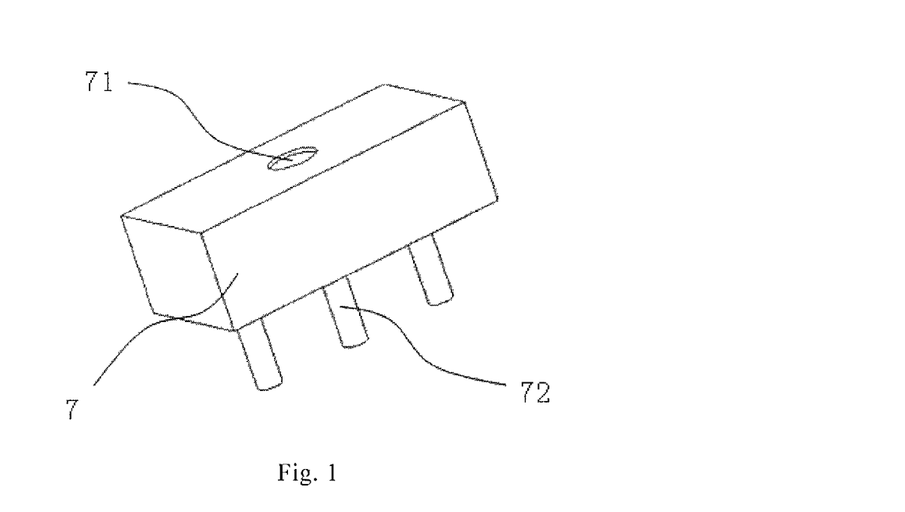
FIG. 1 is a schematic view showing a gas ventilation device of a magnetron sputtering film deposition apparatus.

The structure of a gas ventilation device of a magnetron sputtering apparatus is shown in FIG. 1. The gas ventilation device comprises a gas inlet 71, a gas box 7 and gas ventilation pipes 72. For instance, argon gas is used as a sputtering gas in the operation process of the film deposition apparatus. The argon gas firstly enters the gas box 7 through the gas inlet 71. Then the argon gas is split by the gas ventilation pipes 72 and enters the inside of the vacuum chamber. Though the split-flow is performed by several gas ventilation pipes 72, the gas ventilation manner is difficult to avoid generating disadvantageous impact to the precision equipment in the vacuum chamber and causing certain damages. Moreover, non-uniform distribution of the argon gas in the vacuum chamber may be caused by the gas flow around outlet of the gas ventilation pipes 72, the plasma uniformity may be directly influenced, and the uniformity of the film (such as $SiO_2$ layer or ITO layer) deposited on the substrate is finally influenced. Furthermore, in the periodical maintenance and repair process for the vacuum chamber, due to the huge pressure difference between the vacuum environment and the outside atmosphere, vibration of the equipments in the vacuum chamber and damage may be directly invoked by the impact force to the apparatus in the vacuum chamber during the process of the air rapidly rushing into the vacuum chamber.

Figure 2:
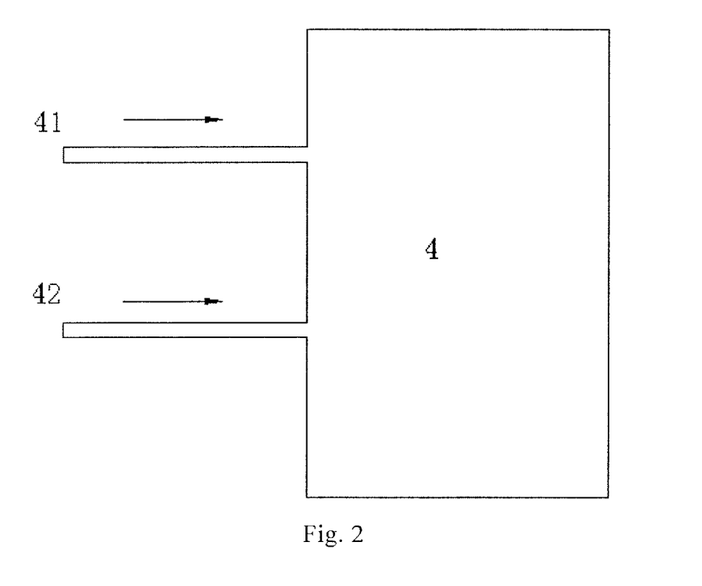
FIG. 2 is a schematic view showing a structure of a magnetron sputtering film deposition vacuum chamber capable of introducing mixed gases.

Furthermore, the film deposition process sometimes needs to be performed in some kinds of mixed atmospheres during the film deposition by magnetron sputtering, in this situation two or more kinds of gases need to be introduced into the film deposition vacuum chamber. The gases may be directly introduced into the vacuum chamber by providing several gas ventilation pipes, the damage to the precision equipment inside the apparatus caused by the direct gas ventilation manner has been mentioned above. Some gas inlets also need to be disposed in the wall of the vacuum chamber. However, the compactness of the whole vacuum apparatus and the vacuum degree (air tightness) of the vacuum chamber are seriously affected by the excessive openings in the wall of the vacuum chamber. When mixed gases need to be introduced into the film deposition vacuum chamber, two gases A and B, for instance, as shown in FIG. 2, the gas A is introduced through the first gas inlet 41, the gas B is introduced through the second gas inlet 42, and because the bore diameters of the gas inlets should not be too big, normally 5 mm to 8 mm, it is difficult to guarantee the gas mixing effect after the mixed gases enter the inside of the vacuum chamber. Even if several split-flow pipes are disposed in the vacuum chamber as shown in FIG. 1, the gas mixing effect is also not ideal. Moreover, due to the limited inside space of the vacuum chamber, excessive split-flow devices are not allowed to be disposed on the gas ventilation device when the apparatus is manufactured. Because the bore diameter of the gas ventilation pipes is limited with respect to the space of the film deposition vacuum chamber, it is difficult to make the mixed gases uniformly distribute around the substrate on which the film is being deposited. Due to the non-uniform distribution of the mixed gases, the quality of the thin film transistor and the properties (for instance the surface evenness, conductive property, and the like, of the thin film transistor) of the product will be directly influenced. Moreover, these devices are unable to satisfy the requirements for the situation in which various gases are uniformly introduced into the film deposition environment of the vacuum chamber.

SUMMARY

The embodiments of present disclosure provide a gas intake device of magnetron sputtering vacuum chamber and a magnetron sputtering apparatus. The distribution uniformity after the gas enters the vacuum chamber will be increased and the gas mixing effect when mixed gases are introduced into the vacuum chamber will be improved by using the gas intake device. The impact force to the precision equipment(s) in the vacuum chamber in the film deposition gas intake process by magnetron sputtering can be effectively decreased, and the service life of the apparatus can be prolonged by using the magnetron sputtering apparatus with the gas intake device.

At least one embodiment of present disclosure provides a gas intake device of magnetron sputtering vacuum chamber, which comprises a gas mixing box configured to receive and mix a gas or gases, a gas intake box configured to introduce the gas or gases into the vacuum chamber, and a connecting pipe configured to connect with the gas mixing box and the gas intake box, and the gas mixing box has one or more gas intake pipes.

In an embodiment of present disclosure, for instance, a buffer plate is disposed in the gas intake box opposite to an opening for the connecting pipe.

In an embodiment of present disclosure, for instance, the buffer plate is a circular plate or an umbrella-shaped curved plate.

In an embodiment of present disclosure, for instance, the gas intake box at least comprises an inner box and an outer box, the inner box is nested in the outer box, a space is provided between the inner box and the outer box, the opening for the connecting pipe is disposed in the inner box, and gas flow holes are distributed on walls of the inner box and the outer box.

In an embodiment of present disclosure, for instance, the gas flow holes of the inner box and the outer box are alternately distributed.

In an embodiment of present disclosure, for instance, the gas flow holes are distributed on side walls and bottom surfaces of the inner box and the outer box.

In an embodiment of present disclosure, for instance, bore diameters of the gas flow holes of the inner box and the outer box are different.

In an embodiment of present disclosure, for instance, the bore diameters of the gas flow holes of the gas intake box are increased in turn from the inner box to the outer box.

In an embodiment of present disclosure, for instance, the connecting pipe comprises an upper connecting pipe connected with the gas mixing box and a lower connecting pipe connected with the gas intake box.

In an embodiment of present disclosure, for instance, a diameter of the upper connecting pipe is greater than that of the lower connecting pipe.

In an embodiment of present disclosure, for instance, the upper connecting pipe is connected with the lower connecting pipe by threaded connection or welded connection.

In an embodiment of present disclosure, for instance, a strainer screen or mesh may be disposed within the connecting pipe. When the connecting pipe comprises an upper connecting pipe connected with the gas mixing box and a lower connecting pipe connected with the gas intake box, the strainer screen may be disposed in the upper connecting pipe and/or the lower connecting pipe.

In an embodiment of present disclosure, for instance, when the gas mixing box is provided with a plurality of gas intake pipes, a portion of or all the gas intake pipes are provided with a height difference on the gas mixing box.

In an embodiment of present disclosure, for instance, a plurality of gas intake pipes are distributed on the opposite side surfaces of the gas mixing box.

The embodiment of present disclosure further provides a magnetron sputtering apparatus comprising a vacuum chamber and a gas intake device of magnetron sputtering vacuum chamber as illustrated in any one of the above embodiments, the gas mixing box is disposed outside the vacuum chamber, and the gas intake box is disposed inside the vacuum chamber.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

1: gas mixing box; 11: first gas intake pipe; 12: second gas intake pipe; 13: third gas intake pipe; 2: gas intake box; 21: inner box; 211: gas flow holes of the inner box; 22: outer box; 221: gas flow holes of the outer box; 3: connecting pipe; 31: upper connecting pipe; 32: lower connecting pipe; 4: vacuum chamber; 41: first gas inlet; 42: second gas inlet; 5: buffer plate; 6: gas intake hole of the gas intake box; 7: gas box; 71: gas inlet of the gas box; 72: gas ventilation pipe; 8: strainer screen or mesh.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components.

The terms "including", "comprising," and other variations thereof, as used in this disclosure, mean "including but not limited to", unless expressly specified or defined otherwise.

The expressions "a", "an", and "the", as used in this disclosure, mean "one or more", unless expressly specified or defined otherwise.

Figure 3:
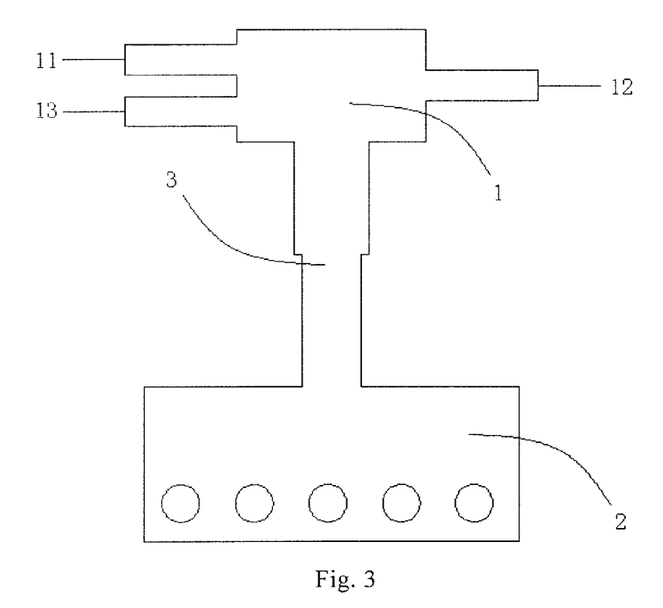
FIG. 3 is a schematic view showing a gas intake device of magnetron sputtering vacuum chamber in an embodiment of present disclosure.

FIG. 3 shows a gas intake device of magnetron sputtering vacuum chamber in an embodiment of present disclosure. The gas intake device comprises a gas mixing box 1 configured to receive and mix gases, a gas intake box 2 configured to introduce the gas into the vacuum chamber, and a connecting pipe 3 configured to connect with the gas mixing box 1 and the gas intake box 2, the gas mixing box 1 has one or more gas intake pipes 11-13. It should be noted that the amount of the gas intake pipes on the gas mixing box may be decided by the kinds of gases needed to be introduced into the vacuum chamber.

Gas or gases firstly flow inside the gas mixing box 1 through the one or more gas intake pipes of the gas mixing box 1 and then enters gas intake box 2 through the connecting pipe 3 after the gas or gases are pre-mixed. Because the gas mixing box 1 is provided prior to the gas intake box 2, the gas or gases are pre-mixed before entering the inside of the gas intake box 2, the distribution uniformity can be increased after the gas enters the inside of the vacuum chamber, the impact force to the precision equipment(s) in the vacuum chamber can be also decreased, and the service life of the apparatus can be prolonged.

The distribution uniformity of the gas (single gas or mixed gases) entering the inside of the magnetron sputtering vacuum chamber can be increased by using the gas intake device of magnetron sputtering vacuum chamber having the configuration of the above mentioned embodiment. When the gas mixing box 1 is provided with a plurality of gas intake pipes 11-13, different gases may be introduced into the vacuum chamber through the different gas intake pipes 11-13, the problem occurring when various gases enter the inside of the vacuum chamber can be solved, and the mixing effect of the mixed gases can be improved.

Figure 4:
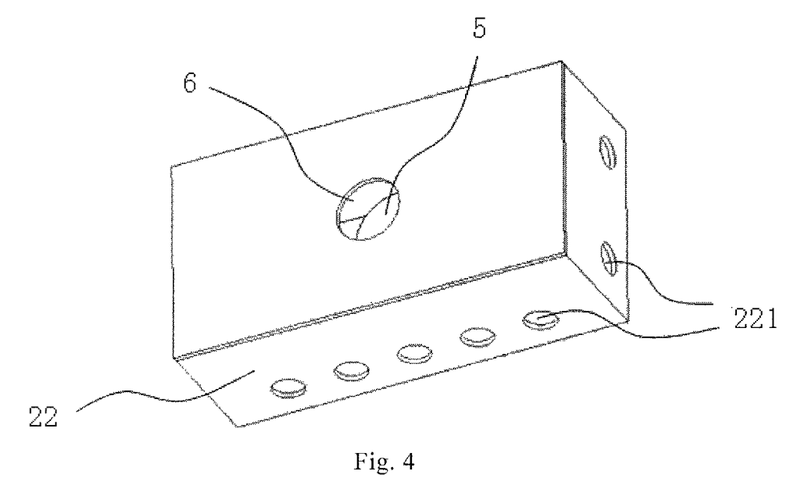
FIG. 4 is a schematic view showing a gas intake box of a gas intake device of magnetron sputtering vacuum chamber in another embodiment of present disclosure.

As shown in FIG. 4, in another embodiment of present disclosure, a buffer plate 5 may be disposed within the gas intake box 2 opposite to the opening for the connecting pipe 3. The connecting pipe 3 is disposed in the gas intake hole 6 of the gas intake box 2. The buffer plate 5 disposed opposite to the gas intake hole 6 of the gas intake box 2 can further buffer the gas and make the gas distribute more uniformly.

The buffer plate 5 may be a circular plate. It should be noted that the shape of the buffer plate is not limited to the circular plate, for instance, a good gas buffer effect may also be achieved by an umbrella-shaped curved plate or other polygon plates.

Figure 5:
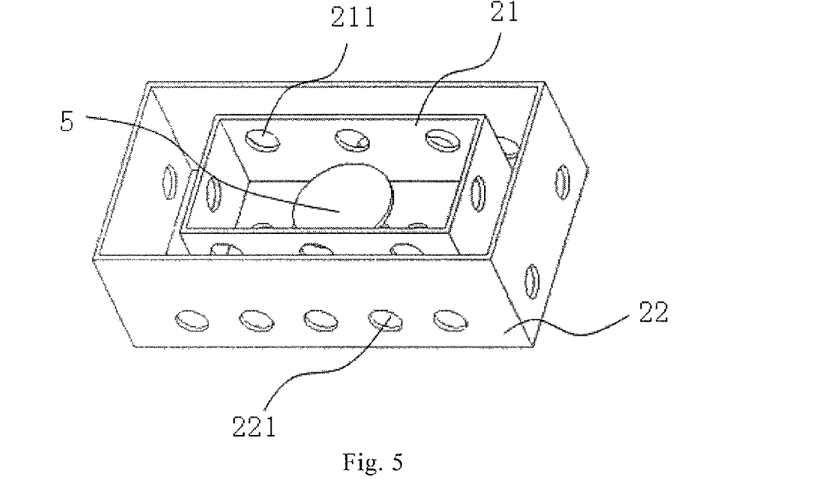
FIG. 5 is a stereogram view of a gas intake box of FIG. 4 lateral cut along its side surfaces.

As shown in FIG. 5, in another embodiment of present disclosure, the gas intake box 2 comprises an inner box 21 and an outer box 22, that is, two boxes in total, the inner box 21 is nested within the outer box 22, a space is formed between the inner box 21 and the outer box 22, and the opening of the connecting pipe 3 is disposed in the inner box 21. Gas flow holes are distributed on the walls of the inner box 21 and the outer box 22. The gas (single gas or mixed gases) enters the gas intake box as illustrated above, and then enters inside the vacuum chamber, so the gas distribution uniformity can be further improved, and the gas distribution uniformity of the gas used in the film forming process during the film deposition process by magnetron sputtering is increased, and the quality of the product may be improved.

For instance, the gas flow holes of the inner box 21 and the outer box 22 may be alternately distributed, for example, partial overlap or no overlap is formed between each other so as to prevent gas from directly rushing into the film deposition vacuum chamber through the gas flow holes of the inner box 21 and the outer box 22. In the process of introducing the gas into the vacuum chamber with the configuration of this embodiment, gas (single gas or mixed gases) enters the inside of the inner box 21 through the gas intake hole, and enters the cavity between the inner box 21 and the outer box 22 through the gas flow holes 211 of the inner box 21, then flows to the vacuum chamber through the gas flow holes 221 of the outer box 22 to react in the film deposition process. Comparing with the aforesaid manner of introducing the gas into the film deposition vacuum chamber directly through pipes, because the gas has already entered the vacuum chamber through several gas flow holes of the inner box 21 and the outer box 22 of the gas intake box 2, the impact force of the gas flow to the vacuum chamber is decreased to a large extent. The gas mixing effect can be notably improved for the mixed gases.

Figure 6:
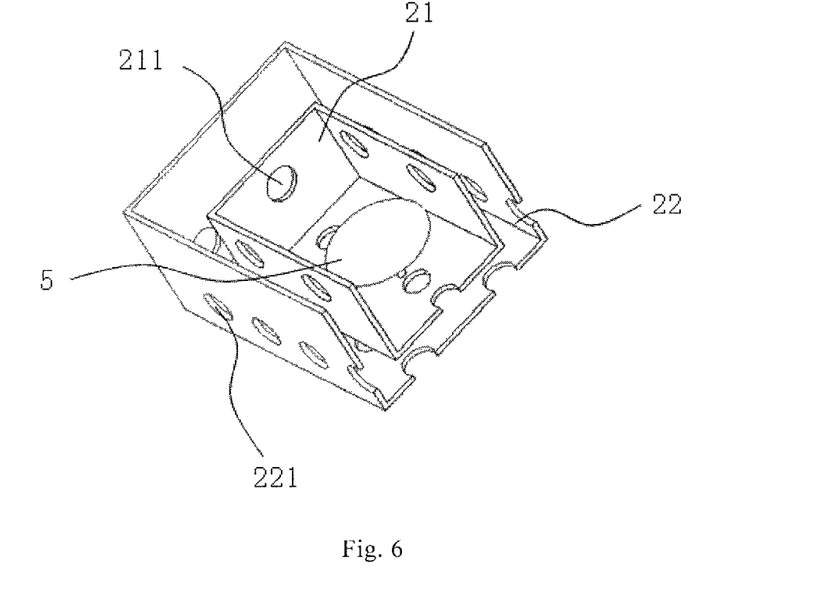
FIG. 6 is a stereogram view of a gas intake box of FIG. 4 vertical cut after lateral cut along its side surfaces.

As shown in FIG. 5 and FIG. 6, in another embodiment of present disclosure, the gas flow holes are distributed on the side walls and bottom surfaces of the inner box 21 and the outer box 22. The gas flow holes in the bottom surfaces are not shown for clarity.

In another embodiment of present disclosure, the bore diameters of the gas flow holes of the inner box 21 and the bore diameters of the gas flow holes of the outer box 22 are different from each other. For instance, the bore diameters of the gas flow holes of the gas intake box 2 are increased in turn from the inner box 22 to the outer box 22. That is, the diameters of the gas flow holes of the outer box 22 are greater than that of the inner box 21. Therefore, on the premise of not affecting the density of the plasma in the film deposition process, the impact force to the equipment(s) in the vacuum chamber by the introduced gas can be minimized as far as possible.

As shown in FIG. 5 and FIG. 6, in another embodiment of present disclosure, a buffer plate 5 is disposed in the gas intake box 2 opposite to the opening for the connecting pipe 3. After the gas enters the inside of the inner box 21, the gas flow is buffered by the buffer plate 5, then enters the cavity between the inner box and the outer box through the gas flow holes 211 of the inner box 21, then flows to the vacuum chamber through the gas flow holes 221 of the outer box 22.

For instance, the gas intake box 2 may comprises several intermediate boxes besides the inner box 21 and the outer box 22, so as to form a nested configuration of a plurality of boxes, the intermediate boxes are also provided with gas flow holes, for instance, if there is only one intermediate box, then three boxes are provided from inner to outer: the inner box 21, the intermediate box, and the outer box 22, the gas flow holes of the inner box 21, the intermediate box, and the outer box 22 are alternatively distributed, and partial overlap or no overlap is formed among one another. Because the good gas distribution uniformity can be obtained by the two boxes nested together, considering the limited space in the vacuum chamber, generally the mode of two or three boxes is appropriate.

Figure 7:
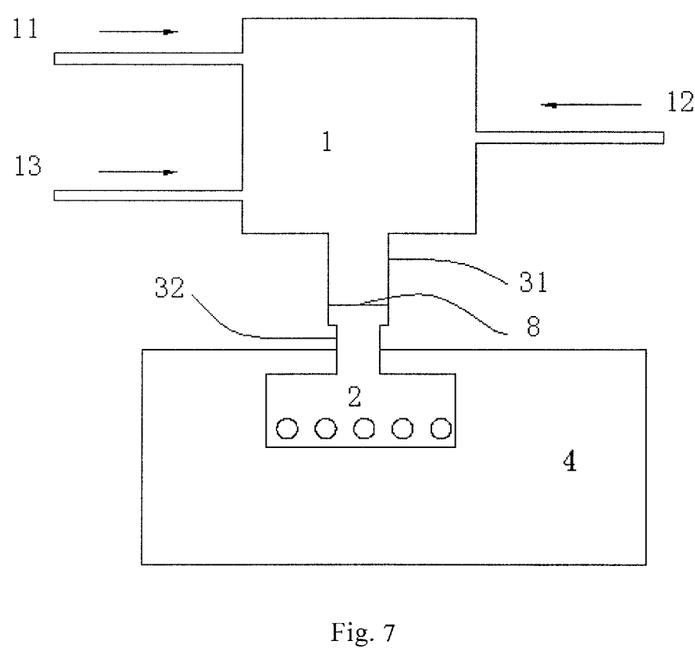
FIG. 7 is a schematic view showing a magnetron sputtering apparatus in an embodiment of present disclosure.

As shown in FIG. 7, in another embodiment of present disclosure, the connecting pipe 3 comprises an upper connecting pipe 31 connected with the gas mixing box 1 and a lower connecting pipe 32 connected with the gas intake box 2.

For instance, a diameter of the upper connecting pipe 31 is greater than that of the lower connecting pipe 32 so as to mix to a greater degree in a relatively greater space during the process of the gas flowing to the lower connecting pipe 32.

In another embodiment of present disclosure, a strainer screen or mesh 8 may be disposed within the connecting pipe 3 to filter the possibly existing solid impurities in the atmosphere. When the connecting pipe 3 comprises an upper connecting pipe 31 connected with the gas mixing box 1 and a lower connecting pipe 32 connected with the gas intake box 2, the strainer screen 8 may be disposed within the upper connecting pipe 31 and/or the lower connecting pipe 32.

In another embodiment of present disclosure, the upper connecting pipe is connected with the lower connecting pipe by threaded connection or welded connection. Via threaded connection, the gas mixing box 1 may be disassembled from the connection with the upper and lower connecting pipe to ease the routine maintenance of the apparatus (for instance, cleaning impurities, dredging strainer screen or the like).

In another embodiment of present disclosure, when the gas mixing box 1 is provided with a plurality of gas intake pipes, a portion of or all the gas intake pipes are provided with a height difference therebetween on the gas mixing box 1. For instance, as shown in FIG. 3, the gas mixing box 1 may be provided with three gas intake pipes, the first gas intake pipe 11, the second gas intake pipe 12, and the third gas intake pipe 13; further, more gas intake pipes may be added as desired. The configuration may be freely chosen according to the gas species when the gases are introduced into the vacuum chamber. The height of the three gas intake pipes are different in FIG. 3, that is, the three gas intake pipes are provided with a height difference therebetween on the gas mixing box. In the Y direction, the first gas intake pipe 11 is highest, and the third gas intake pipe 13 is lowest, where the direction that is towards the top side along the paper is the Y direction. Because the densities of different gases may be different when the mixed gases need to be introduced into the vacuum chamber, for instance, the mixed gases A, B and C are introduced, the densities of the gases are: A>B>C, in order to obtain better gas mixing effect, the lowest third gas intake pipe 13 may be used to introduce gas C with the minimum density, the highest first gas intake pipe 11 may be used to introduce gas A with the maximum density, the second gas intake pipe 12 is used to introduce gas B. Furthermore, in order to fully mix the gases in the gas mixing box, the distance between the gas intake pipes used to introduce the gases is appropriately elected. The distance is related to the venting rate. The ratio of each gas in the mixed gases may be controlled by the venting rate (from a flow meter) of each gas intake pipe.

For instance, mixed gases of argon gas, nitrogen gas, and hydrogen gas need to be introduced in the film deposition process, considering the densities of the three gases, the first gas intake pipe 11 is used to introduce the argon gas, the second gas intake pipe 12 is used to introduce the nitrogen gas, the third gas intake pipe 13 is used to introduce the hydrogen gas. The flow ratio of 1:2:3 may be controlled by the flow meter of the three gas inlets. If only argon gas needs to be introduced, the first gas intake pipe 11 may be used.

In another embodiment of present disclosure, a plurality of gas intake pipes are distributed on opposite side surfaces of the gas mixing box 1.

FIG. 7 shows a magnetron sputtering apparatus comprising a vacuum chamber 4 and a gas intake device of magnetron sputtering vacuum chamber as illustrated in any above-mentioned embodiments. The gas mixing box 1 is disposed outside the vacuum chamber 4, and the gas intake box 2 is disposed inside the vacuum chamber 4.

As shown in FIG. 7, the gas mixing box 1 is provided with three gas intake pipes: the first gas intake pipe 11, the second gas intake pipe 12, and the third gas intake pipe 13, more gas intake pipes may be added as desired. The configuration can be freely selected according to the kinds of gases when the gases are introduced into the vacuum chamber. Because it has been described above that the gas intake pipes are chosen based on the gas components, the description is not repeated here. For adopting the gas intake device, the gases are mixed in the space out of the vacuum chamber when the mixed gases is introduced, only one opening is needed in the wall of the vacuum chamber (where the connecting pipe 3 penetrates the top surface of the vacuum chamber 4). Compared with the manner of directly disposing several openings in the wall of the vacuum chamber, the compactness of the vacuum apparatus is improved. Moreover, since the gas mixing process of the whole gas intake apparatus is completed out of the vacuum chamber, compared with the gas intake manner of directly disposing several openings in the wall of the vacuum chamber, for instance, as shown in FIG. 1 or FIG. 2, no excessive space of the vacuum chamber will be occupied.

By adopting the gas intake device of magnetron sputtering vacuum chamber as illustrated in any one of the embodiments, after the gas enters the gas intake box and is buffered, the impact force of the gas (single gas or mixed gases) to the vacuum chamber of the magnetron sputtering apparatus is decreased, and the damage is also reduced, and the service life of the whole apparatus is prolonged.

Although the present disclosure has been disclosed above with respect to specific embodiments, it should not be limited to these embodiments, as those skilled in the art will appreciate that various changes and modifications are possible without departing from the scope and spirit of the disclosure, the scopes of the disclosure are defined by the accompanying claims.

The invention claimed is:

1. A gas intake device of magnetron sputtering vacuum chamber, comprising:
    a gas mixing box configured to receive and mix a gas or gases,
    a gas intake box configured to introduce the gas or gases into a vacuum chamber, and
    a connecting pipe configured to connect with the gas mixing box and the gas intake box,
    wherein
    the gas intake box at least comprises an inner box and an outer box, the inner box is nested in the outer box, a space is provided between the inner box and the outer box, and gas flow holes are distributed on walls of the inner box and the outer box, an opening of the connecting pipe is disposed in the inner box, to enable the gas or the gases to flow from the inner box to the outer box.

2. The gas intake device of magnetron sputtering vacuum chamber according to claim 1, further comprising: a buffer plate, disposed in the gas intake box, opposite to the opening of the connecting pipe.

3. The gas intake device of magnetron sputtering vacuum chamber according to claim 2, wherein the buffer plate is a circular plate or an umbrella-shaped curved plate.

4. The gas intake device of magnetron sputtering vacuum chamber according to claim 1, wherein the gas flow holes of the inner box and the outer box are alternately distributed.

5. The gas intake device of magnetron sputtering vacuum chamber according to claim 1, wherein the gas flow holes are distributed on side walls and bottom surfaces of the inner box and the outer box.

6. The gas intake device of magnetron sputtering vacuum chamber according to claim 1, wherein bore diameters of the gas flow holes of the inner box and the outer box are different.

7. The gas intake device of magnetron sputtering vacuum chamber according to claim 6, wherein the bore diameters of the gas flow holes of the outer box are larger than that of the inner box.

8. The gas intake device of magnetron sputtering vacuum chamber according to claim 1, wherein the connecting pipe comprises an upper connecting pipe connected with the gas mixing box and a lower connecting pipe connected with the gas intake box.

9. The gas intake device of magnetron sputtering vacuum chamber according to claim 8, wherein a diameter of the upper connecting pipe is greater than that of the lower connecting pipe.

10. The gas intake device of magnetron sputtering vacuum chamber according to claim 8, wherein the upper connecting pipe is connected with the lower connecting pipe by threaded connection or welded connection.

11. The gas intake device of magnetron sputtering vacuum chamber according to claim 1, wherein a strainer screen is disposed within the connecting pipe.

12. The gas intake device of magnetron sputtering vacuum chamber according to claim 1, wherein a plurality of gas intake pipes are distributed on opposite side surfaces of the gas mixing box.

13. A magnetron sputtering apparatus comprising a vacuum chamber and a gas intake device of magnetron sputtering vacuum chamber according to claim 1, wherein the gas mixing box is disposed outside the vacuum chamber, and the gas intake box is disposed inside the vacuum chamber.

14. The gas intake device of magnetron sputtering vacuum chamber according to claim 2, wherein the gas intake box at least comprises an inner box and an outer box, the inner box is nested in the outer box, a space is provided between the inner box and the outer box, the opening for the connecting pipe is disposed in the inner box, and gas flow holes are distributed on walls of the inner box and the outer box.

15. The gas intake device of magnetron sputtering vacuum chamber according to claim 2, wherein bore diameters of the gas flow holes of the outer box are larger than that of the inner box.

16. The gas intake device of magnetron sputtering vacuum chamber according to claim 2, wherein the connecting pipe comprises an upper connecting pipe connected with the gas mixing box and a lower connecting pipe connected with the gas intake box.

17. The gas intake device of magnetron sputtering vacuum chamber according to claim 4, wherein the connecting pipe comprises an upper connecting pipe connected with the gas mixing box and a lower connecting pipe connected with the gas intake box.

18. The gas intake device of magnetron sputtering vacuum chamber according to claim 2, wherein in a case that the gas mixing box is provided with a plurality of gas intake pipes, a portion of or all the gas intake pipes are provided with a height difference on the gas mixing box.

19. The gas intake device of magnetron sputtering vacuum chamber according to claim 2, wherein the gas flow holes are distributed on side walls and bottom surfaces of the inner box and the outer box.

* * * * *